(12) United States Patent
Grote et al.

(10) Patent No.: US 8,193,585 B2
(45) Date of Patent: Jun. 5, 2012

(54) SEMICONDUCTOR DEVICE WITH INCREASED SNAPBACK VOLTAGE

(75) Inventors: Bernhard H. Grote, Phoenix, AZ (US);
Vishnu K. Khemka, Phoenix, AZ (US);
Tahir A. Khan, Tempe, AZ (US);
Weixiao Huang, Tempe, AZ (US);
Ronghua Zhu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 408 days.

(21) Appl. No.: 12/608,586

(22) Filed: Oct. 29, 2009

(65) Prior Publication Data

US 2011/0101425 A1 May 5, 2011

(51) Int. Cl.
*H01L 29/66* (2006.01)
(52) U.S. Cl. .................. 257/343; 257/E29.258
(58) Field of Classification Search .................. 257/343, 257/E29.258
See application file for complete search history.

(56) References Cited

U.S. PATENT DOCUMENTS

| | | | |
|---|---|---|---|
| 6,329,692 B1 | 12/2001 | Smith | |
| 6,528,380 B2 | 3/2003 | Woolery et al. | |
| 7,087,973 B2 | 8/2006 | Mallikarjunaswamy et al. | |
| 7,282,386 B2 | 10/2007 | Khemka et al. | |
| 2011/0101425 A1* | 5/2011 | Grote et al. | 257/288 |

OTHER PUBLICATIONS

Lee, J., et al., The Influence of NBL Layout and LOCOS Space on Component ESD and System Level ESD for HV-LDMOS, 19th International Symposium on Power Semiconductor Devices and IC, 2007, May 27-31, 2007, pp. 173-176.
Parthasarathy, V., et al., SOA improvement by a double RESURF LDMOS technique in a power IC technology, IEDM, IEEE, 2000, pp. 75-78, Dec. 2000.

* cited by examiner

*Primary Examiner* — Mark Prenty
(74) *Attorney, Agent, or Firm* — Ingrassia Fisher & Lorenz, PC (57) ABSTRACT

Methods and apparatus are provided for fabricating a semiconductor device structure. The semiconductor device structure comprises a buried region having a first conductivity type, a first region having a second conductivity type overlying the buried region, a source region having the first conductivity type overlying the first region, and a drain region having the first conductivity type overlying the first region. The semiconductor device structure further comprises a second region having the first conductivity type overlying the buried region, the second region abutting the buried region to form an electrical contact with the buried region, and a first resistance configured electrically in series with the second region and the buried region. The combined series resistance of the first resistance and the second region is greater than a resistance of the buried region.

20 Claims, 6 Drawing Sheets

SEMICONDUCTOR DEVICE WITH INCREASED SNAPBACK VOLTAGE

TECHNICAL FIELD

Embodiments of the subject matter described herein relate generally to semiconductor devices and methods for fabricating semiconductor devices, and more particularly, embodiments of the subject matter relate to methods for fabricating laterally diffused semiconductor devices having increased snapback voltage.

BACKGROUND

An integrated circuit can be damaged when subjected to a voltage that is higher than the design voltage of the integrated circuit. Electrostatic discharge ("ESD") originating from a source external to the integrated circuit can generate a voltage that is many times greater than the design voltage of the integrated circuit. Therefore, many integrated circuits incorporate ESD protection circuitry to prevent damage that may result from a voltage exceeding the normal operating voltage.

One mechanism that can cause circuit failures during ESD events is a phenomenon known as "bipolar snapback," wherein an excessive voltage causes a parasitic bipolar transistor inside a MOS device to turn on causing the current consumed by the MOS device to rapidly multiply and potentially resulting in irreversible damage to the MOS device. Usually, the parasitic bipolar transistor inherently contained in the N-channel MOS device of, for example, an output buffer, is the most susceptible to snapback and is frequently the point of failure in a circuit subjected to an ESD event. In some implementations, an N-channel double reduced surface field (RESURF) laterally diffused metal oxide semiconductor (LDMOS) device includes first parasitic NPN bipolar transistor between the N-type drain region and N-type source region (the lateral parasitic bipolar device) and a second parasitic NPN bipolar transistor between an N-type buried layer and the N-type source region (the vertical parasitic bipolar device).

During normal operation, the rated drain-to-source voltage of the LDMOS device is constrained by the breakdown voltage of the device, that is, the drain-to-source voltage is maintained at or below the drain-to-source voltage that causes avalanche breakdown in the LDMOS device. If the drain-to-source voltage of the LDMOS device exceeds the breakdown voltage during an ESD event, the LDMOS device remains operable and will continue to function normally provided the drain-to-source voltage decreases to a level below the breakdown voltage. However, if the drain-to-source voltage exceeds the snapback voltage during an ESD event, that is, the drain-to-source voltage that causes either and/or both of the parasitic bipolar transistors to turn on, the current consumed by the LDMOS device rapidly multiplies. Accordingly, to avoid interfering with normal operation, the ESD protection circuitry for an LDMOS device is typically designed to respond to a drain-to-source voltage greater than the rated voltage but less than the snapback voltage. However, efforts to minimize the on-resistance of the LDMOS device will limit the margin (i.e., the voltage difference) between the rated drain-to-source voltage and the actual breakdown voltage. Consequently, the margin between the rated source-to-drain voltage and the snap-back voltage will also be limited as the snap-back voltage is typically close to the break-down voltage, resulting in a narrow design window and more stringent manufacturing requirements for the ESD protection circuitry.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

FIGS. 1-10 illustrate, in cross section, methods for fabricating a double reduced surface field (RESURF) laterally diffused metal oxide semiconductor (LDMOS) device in accordance with exemplary embodiments. Various steps in the manufacture of LDMOS components are well known and so, in the interest of brevity, many conventional steps will only be mentioned briefly herein or will be omitted entirely without providing the well known process details. Although "MOS" properly refers to a device having a metal gate electrode and an oxide gate insulator, the subject matter may be utilized with any semiconductor device that includes a conductive gate electrode (whether metal or other conductive material) that is positioned over a gate insulator (whether oxide or other insulator) which, in turn, is positioned over a semiconductor substrate, and the subject matter is not intended to be limited to a metal gate electrode and an oxide gate insulator. Furthermore, it should be appreciated that although the subject matter may be described herein in the context of an N-type (or N-channel) device, the subject matter is not intended to be limited to N-type devices and may be implemented in an equivalent manner for a P-type (or P-channel) device.

Figure 1:
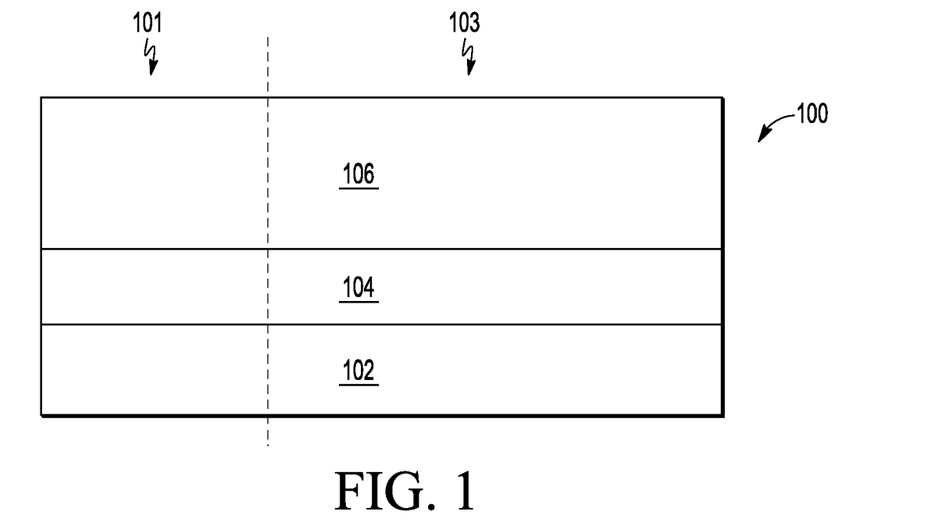
FIGS. 1-10 illustrate, in cross section, a semiconductor device structure including a LDMOS transistor structure and exemplary methods for fabricating the semiconductor device in accordance with one embodiment of the invention.

Referring to FIG. 1, the illustrated fabrication process begins by providing an appropriate semiconductor substrate 102 and forming a buried region 104 (alternatively referred to herein as a buried layer) of semiconductor material having a first conductivity-determining impurity type underlying a region 106 of semiconductor material having a second conductivity-determining impurity type. In an exemplary embodiment, the region 106 of semiconductor material is realized as an epitaxial layer of semiconductor material overlying the semiconductor substrate 102 and/or buried layer 104, and accordingly, for convenience but without limitation, the region 106 is alternatively referred to herein as the epitaxial layer. As described in greater detail below, in an exemplary embodiment, the completed semiconductor device includes an isolation structure formed in a first region 101 of the epitaxial layer 106 for biasing the buried layer 104 to a particular voltage potential and a transistor structure formed in a second region 103 of the epitaxial layer 106. Accordingly, the first region 101 may be alternatively referred to herein as the isolation region and the second region 103 may be alternatively referred to herein as the transistor region.

In an exemplary embodiment, the semiconductor substrate 102 is realized as a bulk substrate formed from or otherwise comprising a semiconductor material (alternatively referred to herein as the bulk semiconductor material). The bulk semiconductor material 102 is preferably a silicon material as typically used in the semiconductor industry, e.g., relatively pure silicon as well as silicon admixed with other elements such as germanium, carbon, and the like. Alternatively, bulk semiconductor material 102 can be germanium, gallium arsenide, or the like. In an exemplary embodiment, for an N-type device, the bulk semiconductor material 102 is realized as a very lightly doped P-type semiconductor material. For example, the bulk semiconductor material 102 may be realized as silicon having a P-type dopant concentration (e.g., boron ions or a boron ionized species) in the range of about $1 \times 10^{15}/cm^3$ to about $1 \times 10^{19}/cm^3$. However, in alternative embodiments, the bulk semiconductor material need not be doped or may be very lightly doped as N-type without impacting the fabrication process described herein. Furthermore, it should be appreciated that the subject matter described herein is not limited to bulk semiconductor substrates, and practical embodiments of the semiconductor device structure described herein may be realized using a semiconductor-on-insulator (SOI) substrate or another suitable semiconductor substrate.

In an exemplary embodiment, the buried layer 104 is formed by implanting ions of the first conductivity-determining impurity type in the bulk semiconductor material 102. For an N-channel semiconductor device, the buried layer 104 is realized as an N-type buried layer (NBL) by implanting N-type ions, such as, phosphorous ions (or a phosphorous ionized species) or antimony ions (or an antimony ionized species), with a dopant concentration in the range of about $2 \times 10^{17}/cm^3$ to about $1 \times 10^{20}/cm^3$. For example, in accordance with one embodiment, the buried layer 104 is formed by implanting antimony ionized species or antimony ions with a dopant concentration of about $2 \times 10^{19}/cm^3$. In this regard, the buried layer 104 is preferably of the opposite conductivity type as the semiconductor substrate 102.

In an exemplary embodiment, the epitaxial layer 106 is formed overlying the buried layer 104 by epitaxially growing a layer of semiconductor material on the bulk semiconductor material 102, resulting in the semiconductor device structure 100 of FIG. 1. In an exemplary embodiment, the bulk semiconductor material 102 comprises silicon, wherein the epitaxial layer 106 is formed by epitaxially growing a silicon material on the bulk semiconductor material 102 in accordance with known process techniques. The thickness of the epitaxial layer 106 may be chosen to achieve desired breakdown voltage and/or snapback voltage characteristics, and typically ranges from about 2 micrometers (or microns) to about 10 micrometers, however, practical embodiments may utilize a different thickness as needed for a particular application. In an exemplary embodiment, the epitaxial layer 106 has conductivity type opposite that of the buried layer 104. In this regard, for an N-channel semiconductor device where the buried layer 104 is realized as an N-type buried layer (NBL), the epitaxial layer 106 is realized as a P-type epitaxial layer having a dopant concentration (e.g., boron ions or a boron ionized species) in the range of about $1 \times 10^{15}/cm^3$ to about $1 \times 10^{16}/cm^3$. Preferably, the epitaxial layer 106 is in-situ doped during the epitaxial formation, however, in alternative embodiments, the epitaxial layer 106 may be doped by performing ion implantation subsequent to the epitaxial formation.

It should be appreciated that the fabrication of a semiconductor device need not always begin with a bulk substrate, but rather, an embodiment of the fabrication process may instead begin with the semiconductor device structure 100 depicted in FIG. 1. Thus, a suitably pre-fabricated wafer could be obtained from a vendor, where the pre-fabricated wafer would have bulk semiconductor material having a buried (or intermediate) layer of a first conductivity type, and an overlying layer of a second conductivity type. Accordingly, fabrication of the semiconductor device described herein may begin by providing such a pre-fabricated wafer or substrate. In this regard, it should be appreciated that in some embodiments, the bulk semiconductor material 102 may be doped with the appropriate dopant type(s) and concentration(s), and in such embodiments, the semiconductor device structure 100 need not include an epitaxial layer 106.

Figure 2:
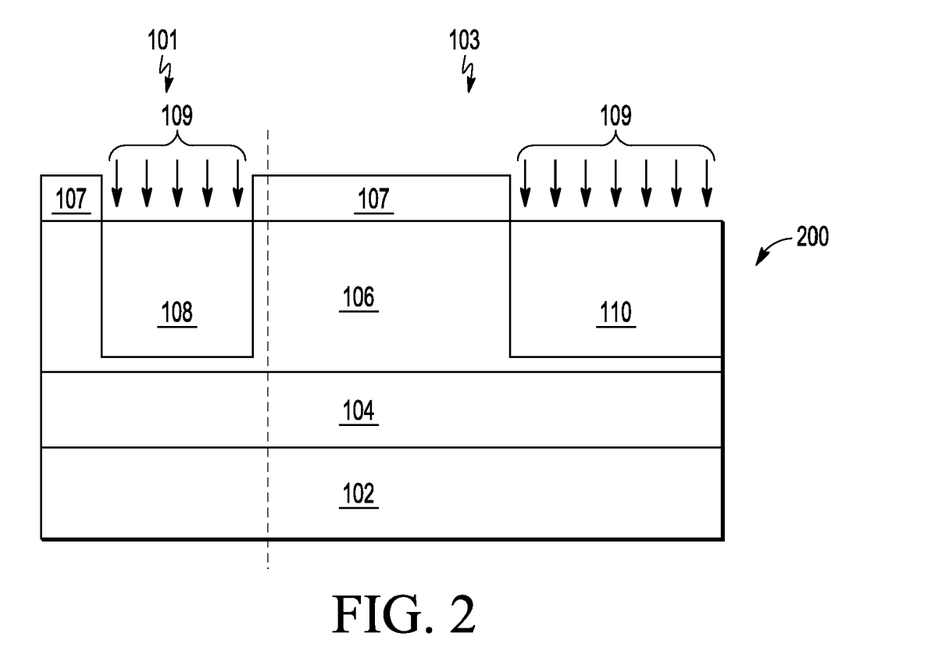

Referring now to FIG. 2, in an exemplary embodiment, the fabrication process continues by forming regions 108, 110 of the second conductivity-determining impurity type in the epitaxial layer 106. In this regard, the regions 108, 110 are of the same conductivity-type as the epitaxial layer 106, but may be more heavily doped. In an exemplary embodiment, the regions 108, 110 have the same dopant concentration and are formed during the same ion implantation step, however, in alternative embodiments, the dopant concentration of the regions 108, 110 need not be equal and/or the regions 108, 110 may formed during separate implantation steps. In an exemplary embodiment, the regions 108, 110 are formed by masking the semiconductor device structure 100 with an implantation mask 107 that leaves exposed the underlying regions of the epitaxial layer 106 to be used for regions 108, 110. The regions 108, 110 are then formed by implanting ions of the second conductivity-determining impurity type, illustrated by arrows 109, in the epitaxial layer 106 with a dopant concentration in the range of about $5 \times 10^{15}/cm^3$ to about $5 \times 10^{17}/cm^3$, resulting in the semiconductor device structure 200 of FIG. 2. For example, in accordance with one embodiment, for an N-channel semiconductor device, regions 108, 110 are formed by implanting P-type ions, such as boron ions or a boron ionized species, with a dopant concentration of about $3 \times 10^{16}/cm^3$ to about $4 \times 10^{16}/cm^3$. As shown in FIG. 2, the depth of the implantation for regions 108, 110 may be less than the thickness of the epitaxial layer 106.

Figure 3:
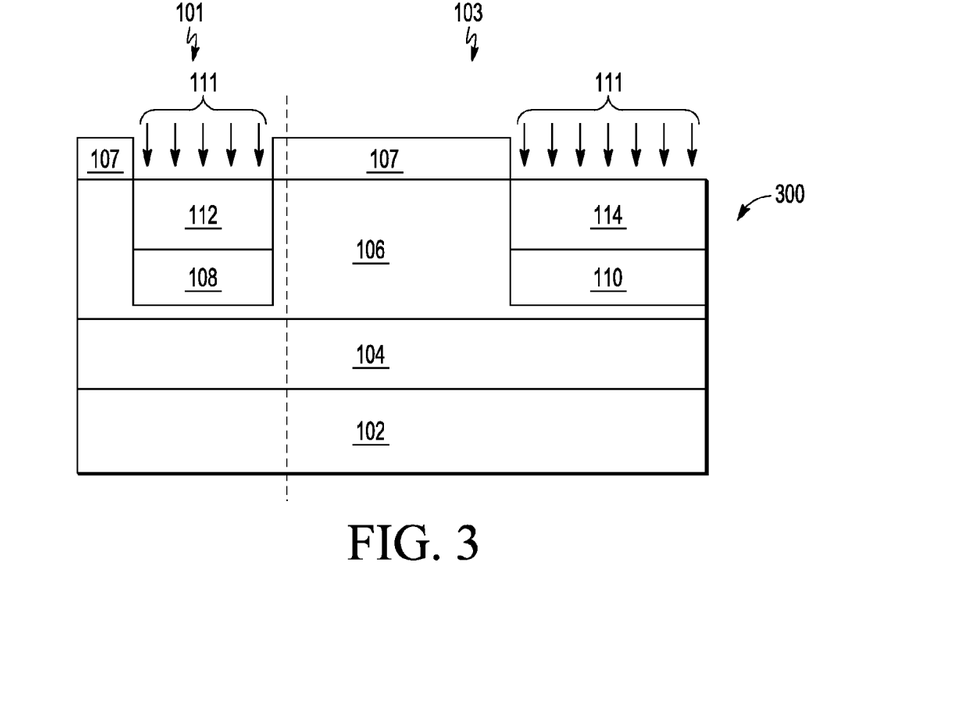

Referring now to FIG. 3, in an exemplary embodiment, the fabrication process continues by forming regions 112, 114 of the first conductivity-determining impurity type within the regions 108, 110 of the epitaxial layer 106. In this regard, the regions 112, 114 have a conductivity-type opposite the epitaxial layer 106 and regions 108, 110 but have the same conductivity-type as the buried layer 104. In an exemplary embodiment, the regions 112, 114 are more lightly doped than the buried layer 104, and the regions 112, 114 have the same dopant concentration and are formed during the same ion implantation step, however, in alternative embodiments, the dopant concentration of the regions 112, 114 need not be equal and/or the regions 112, 114 may formed during separate implantation steps. In an exemplary embodiment, the regions 112, 114 are formed by implanting ions of the first conductivity-determining impurity type, illustrated by arrows 111, in the epitaxial layer 106 using the same implantation mask 107 as was used for regions 108, 110, resulting in the semiconductor device structure 300 of FIG. 3. For example, in accordance with one embodiment, for an N-channel semiconductor device, the regions 112, 114 are formed by implanting N-type ions, such as phosphorous ions or a phosphorous ionized species, with a dopant concentration in the range of about $5 \times 10^{15}/cm^3$ to about $5 \times 10^{17}/cm^3$. In an exemplary embodiment, phosphorous ions or a phosphorous ionized species are implanted with a dopant concentration of about $3 \times 10^{16}/cm^3$ to about $4 \times 10^{16}/cm^3$.

As shown in FIG. 3, the depth of the implantation for regions 112, 114 is shallower than the implantation of regions 108, 110 such that at least a portion of the regions 108, 110 underlies and isolates a respective region 112, 114 from the buried layer 104. The regions 112, 114 of the first conductivity-type form N-drift regions, respectively, for an isolation structure subsequently formed in the isolation region 101 and a transistor structure subsequently formed in the transistor region 103. In this regard, region 114 functions as a drain region for the subsequently formed transistor structure, wherein the dopant concentration of region 114 affects both the on-resistance and the breakdown voltage of the subsequently formed transistor. Thus, increasing the dopant concentration of region 114 decreases the on-resistance and the breakdown voltage of the subsequently formed transistor while decreasing the dopant concentration increases the on-resistance and breakdown voltage of the transistor. As described in greater detail below, region 112 increases the series resistance of the vertical parasitic bipolar transistor in the completed semiconductor device structure, and accordingly, may be referred to herein for convenience, but without limitation, as the resistive region.

Figure 4:
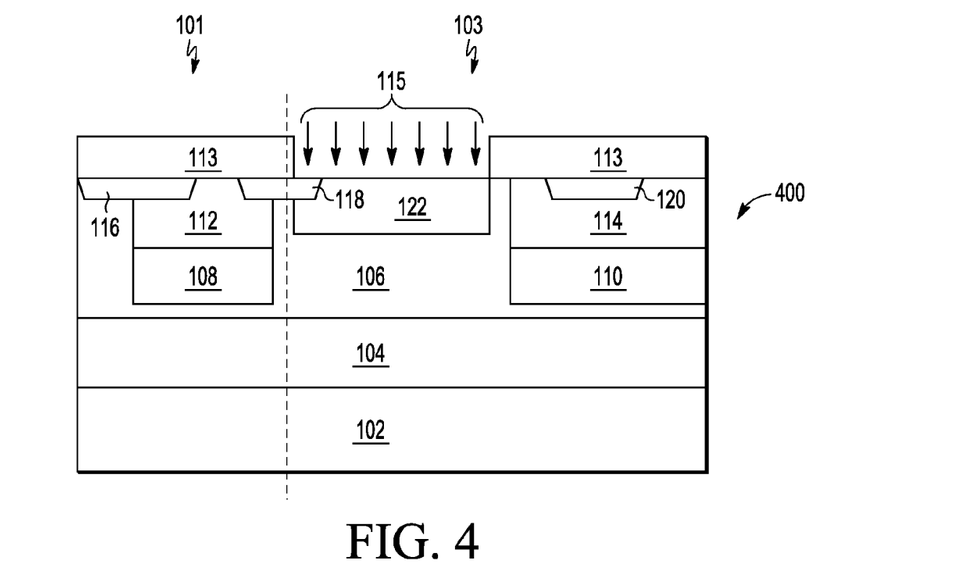

Referring now to FIG. 4, in an exemplary embodiment, the fabrication process continues by removing the implantation mask 107 and forming dielectric regions 116, 118, 120 within the epitaxial layer 106. In an exemplary embodiment, the dielectric regions 116, 118, 120 are formed by shallow trench isolation (STI) in a conventional manner, for example, by selectively etching trenches into the surface of the epitaxial layer 106 using a suitably configured etch mask and forming a dielectric material, such as an oxide material, in the trenches. In an exemplary embodiment, the trenches are etched to a depth that is less than the depth of regions 112, 114. As described in greater detail below, the first dielectric region 116 insulates (or isolates) a subsequently formed doped region underlying the first dielectric region 116 from a contact region subsequently formed in region 112. The second dielectric region 118 isolates the resistive region 112 from the transistor structure subsequently formed in the transistor region 103, and the third dielectric region 120 isolates a subsequently formed gate structure from a subsequently formed drain contact region, as described in greater detail below.

In an exemplary embodiment, the fabrication process continues by forming a body region 122 of the second conductivity-determining impurity type within the transistor region 103 of the epitaxial layer 106, resulting in the semiconductor device structure 400 of FIG. 4. In this regard, the body region 122 functions as the body of the subsequently formed transistor structure and has the same conductivity-type of the epitaxial layer 106, but may be more heavily doped. In an exemplary embodiment, the body region 122 is formed by masking the semiconductor device structure 300 with an implantation mask 113 that leaves exposed the underlying region of the epitaxial layer 106 to be used for the body region 122. The body region 122 is then formed by implanting ions of the second conductivity-determining impurity type, illustrated by arrows 115, in the epitaxial layer 106 using the implantation mask 113. For example, in accordance with one embodiment, for an N-channel semiconductor device, the body region 122 is formed by implanting P-type ions, such as boron ions or a boron ionized species, with a dopant concentration in the range of about $5 \times 10^{16}/cm^3$ to about $5 \times 10^{18}/cm^3$. In an exemplary embodiment, boron ions or a boron ionized species are implanted with a dopant concentration of about $2 \times 10^{17}/cm^3$ to about $4 \times 10^{17}/cm^3$ to create the P-well of the subsequently formed transistor. As shown in FIG. 4, in accordance with one embodiment, the body region 122 abuts the second dielectric region 118, and the implantation energy is such that ions penetrate the second dielectric region 118 such that a portion of the body region 122 underlies a portion of the second dielectric region 118. The depth of the implantation for the body region 122 is preferably less than the thickness of the epitaxial layer 106 to support a greater breakdown voltage for the subsequently formed transistor structure. In an exemplary embodiment, the thickness of the region of the epitaxial layer 106 between the body region 122 and the buried layer 104 is at least 0.5 micrometers.

Figure 5:
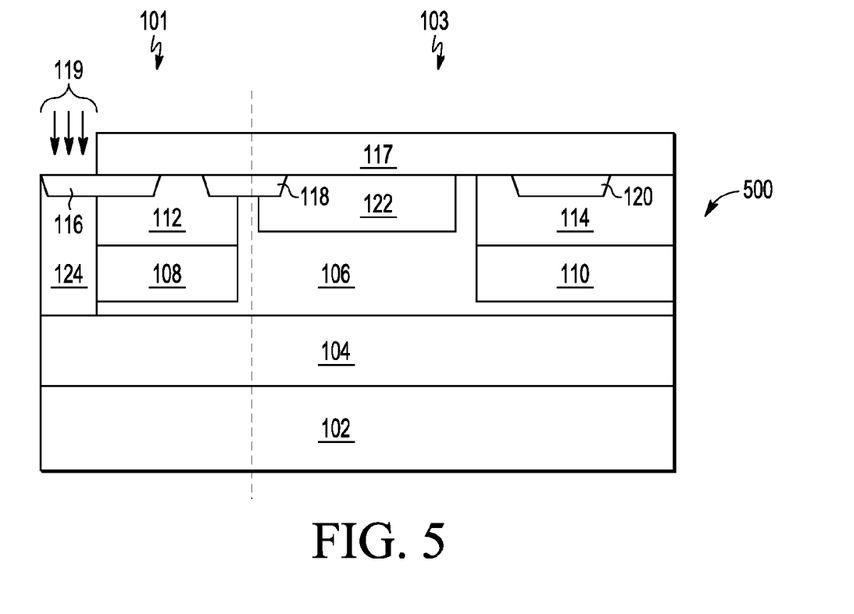

Referring now to FIG. 5, in an exemplary embodiment, the fabrication process continues by removing the implantation mask 113 and forming an isolation tie region 124 of the first conductivity-determining impurity type underlying the first dielectric region 116 and abutting the resistive region 112 and the buried layer 104. In this regard, the isolation tie region 124 has a conductivity-type opposite the epitaxial layer 106 and regions 108, 110 but has the same conductivity-type as the buried layer 104 and the resistive region 112. In an exemplary embodiment, the isolation tie region 124 has a dopant concentration greater than the dopant concentration of resistive region 112 to provide a low resistive conductive contact to the buried layer 104, but the dopant concentration of the resistive region 112 is typically less than the dopant concentration of the buried layer 104. The isolation tie region 124 may be formed by masking the semiconductor device structure 400 with an implantation mask 113 that leaves exposed the underlying region of the epitaxial layer 106 to be used for the isolation tie region 124. The isolation tie region 124 is then formed by implanting ions of the first conductivity-determining impurity type, illustrated by arrows 119, in the epitaxial layer 106 of the isolation region 101 using the implantation mask 117 resulting in the semiconductor device structure 500. For example, in accordance with one embodiment, for an N-channel semiconductor device, the isolation tie region 124 is formed by implanting N-type ions, such as phosphorous ions or a phosphorous ionized species, with a dopant concentration in the range of about $5 \times 10^{16}/cm^3$ to about $5 \times 10^{18}/cm^3$. For example, phosphorous ions or a phosphorous ionized species may be implanted with a dopant concentration of about to about $2 \times 10^{17}/cm^3$ to about $4 \times 10^{17}/cm^3$. As shown in FIG. 5, the implantation for the isolation tie region 124 is a deep ion implantation with sufficient energy to penetrate the dielectric region 116. In this regard, the depth of the ion implantation for isolation tie region 124 is at least as thick (or deep) as the epitaxial layer 106, to ensure that the isolation tie region 124 abuts and forms an electrical connection with the underlying buried layer 104. In this regard, in some embodiments, a portion of the isolation tie region 124 may extend or penetrate the buried layer 104 such that the portion of the isolation tie region 124 is formed within the buried layer 104. Because the isolation tie region 124 has the same conductivity-type of the buried layer 104 and the resistive region 112, the resistive region 112 and the buried layer 104 are electrically connected in via the isolation tie region 124. In this regard, the resistive region 112 and the isolation tie region 124 provide an isolation path to the buried layer 104 for biasing the buried layer 104 to a voltage that may be applied to the upper surface of the semiconductor device structure 500 overlying the resistive region 112.

Figure 6:
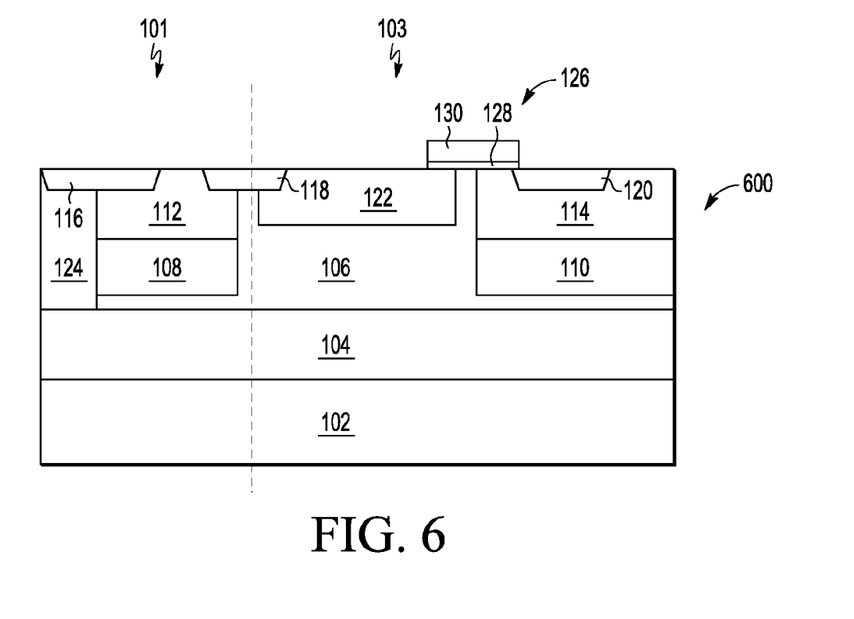

Referring now to FIG. 6, in an exemplary embodiment, the fabrication process continues by removing the implantation mask 117 and forming a gate structure 126 overlying the transistor region 103 of the epitaxial layer 106. In an exemplary embodiment, the gate structure 126 overlies at least a portion of the body region 122 to allow an inversion channel to form in the body of the subsequently formed transistor during operation, as will be appreciated in the art. In the illustrated embodiment, the right sidewall of the gate structure 126 extends past the leftmost edge of the dielectric region 120, and the left sidewall of the gate structure 126 extends past the rightmost edge of the body region 122. A portion of the gate structure 126 overlies a portion of the drain region 114 and functions as an accumulation region while another portion of the gate structure 126 overlies a portion of the dielectric region 120 and functions as a field plate in the subsequently formed transistor structure. In this regard, the size of the accumulation region, that is, the portion of the drain region 114 underlying the gate structure 126, and/or the length of the drift region as defined by the portion of the drain region 114 underneath dielectric region 120, may be adjusted to achieve a desired breakdown voltage for a particular application. The gate structure 126 may be formed in a conventional manner, for example, by depositing one or more layers of dielectric material 128 overlying the semiconductor device structure 500, depositing one or more layers of conductive (or semiconductive) material 130 overlying the one or more layers of dielectric material, and etching the layers of dielectric material and conductive material to form the gate structure 126. For example, a layer of an oxide material may be deposited overlying the semiconductor device structure 500 of FIG. 5, a layer of conductive metal and/or polysilicon may be deposited overlying the layer of the oxide material, and the layer of oxide material and the conductive metal and/or polysilicon may be masked and anisotropically etched, resulting in the semiconductor device structure 600 of FIG. 6.

Figure 7:
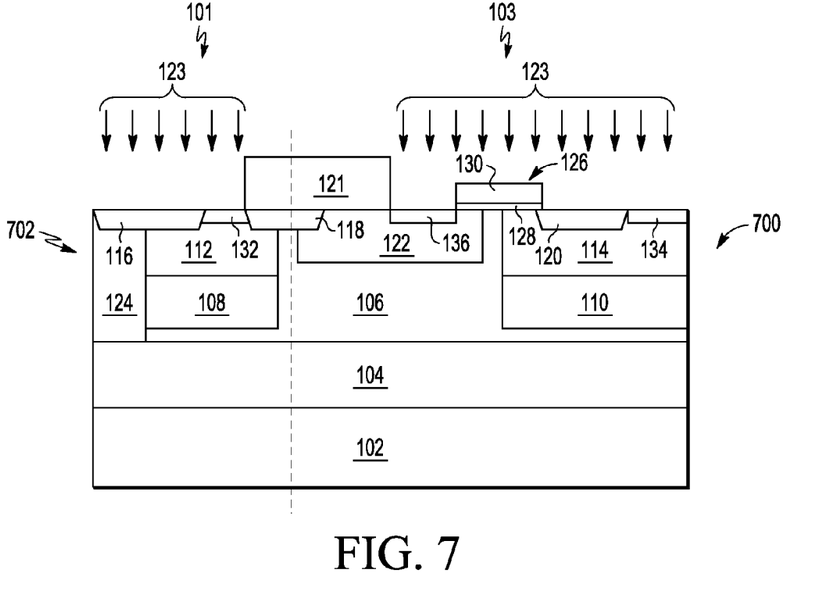
Figure 8:
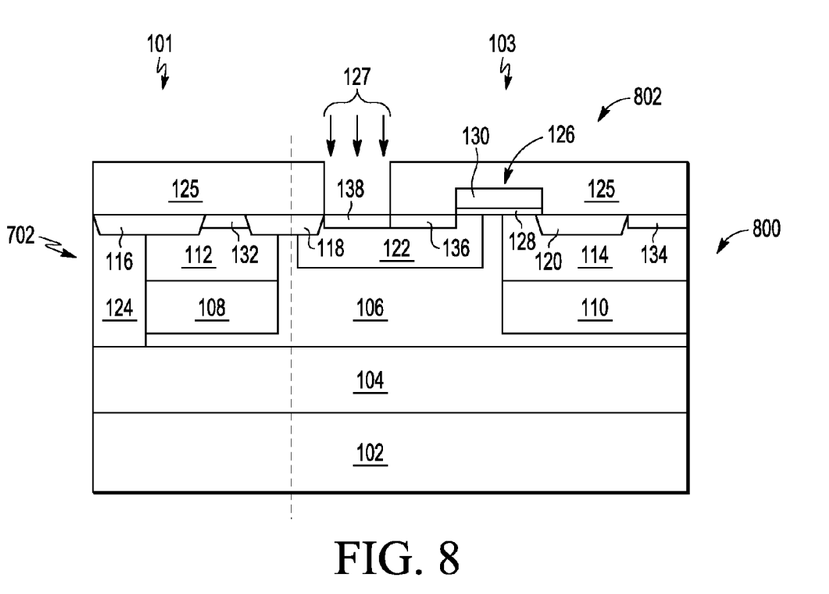

Referring now to FIG. 7 and FIG. 8, in an exemplary embodiment, after forming the gate structure 126, the fabrication process continues by forming doped contact regions 132, 134, 136, 138 for subsequently forming electrical connections between the semiconductor device structure and external circuitry. In this regard, the contact regions 132, 134, 136, 138 are relatively heavily doped such that they have low resistivity. In an exemplary embodiment, an isolation contact region 132 is formed within the resistive region 112 by masking the semiconductor device structure 600 with an implantation mask 121 that leaves exposed the underlying region of the epitaxial layer 106 to be used for the isolation contact region 132. In an exemplary embodiment, the isolation contact region 132 is formed concurrently with the drain/source contact regions 134, 136 in a single implantation step, such that the implantation mask 121 also leaves exposed underlying regions of the epitaxial layer 106 to be used for the drain/source contact regions 134, 136. The contact regions 132, 134, 136 are then formed by implanting ions of the first conductivity-determining impurity type, illustrated by arrows 123, in the exposed portions of regions 112, 114, 122 using the implantation mask 121 resulting in the semiconductor device structure 700 of FIG. 7. For example, in accordance with one embodiment, for an N-channel semiconductor device, the contact regions 132, 134, 136 are formed by implanting N-type ions, such as phosphorous ions or a phosphorous ionized species, with a dopant concentration in the range of about $1 \times 10^{19}/cm^3$ to about $1 \times 10^{21}/cm^3$. For example, phosphorous ions or a phosphorous ionized species may be implanted with a dopant concentration of about $1 \times 10^{20}/cm^3$. The isolation contact region 132 has the same conductivity-type as the resistive region 112 and the isolation tie region 124, but the isolation contact region 132 is more heavily doped, that is, the isolation contact region 132 has a higher dopant concentration and/or lower resistance. Similarly, the drain contact region 134 has the same conductivity-type as the drain region 114 but is more heavily doped. It will be appreciated that the source contact region 136 functions as the source (or source region) for the subsequently formed LDMOS transistor structure. As shown in FIG. 7, contact regions 132, 134, 136 are formed with a shallow ion implantation, such that the ions do not penetrate the dielectric regions 116, 120 depth of the contact regions 132, 134, 136 is less than the thickness (or depth) of the underlying regions 112, 122, 114. In alternative embodiments, the contact regions 132, 134, 136 may be formed with separate ion implantations steps and/or differing dopant concentrations. It should be noted that in some embodiments, the gate structure 126 may be doped during the ion implantation step used to form contact regions 132, 134, 136, as will be appreciated in the art.

By virtue of the isolation contact region 132, the resistive region 112, the isolation tie region 124, and the buried layer 104 having the same conductivity-type, the buried layer 104 and the isolation contact region 132 are electrically connected via the isolation tie region 124 and the resistive region 112. In this regard, the resistive region 112 and the isolation tie region 124 comprise an isolation structure 702 for biasing the buried layer 104 to the voltage potential of the isolation contact region 132. By virtue of the dielectric region 116 and region 108, current flowing from the isolation contact region 132 to the buried layer 104 flows through the portion of the resistive region 112 interposed between the isolation contact region 132 and the isolation tie region 124, such that the resistive region 112 forms a resistance electrically in series with the isolation tie region 124 between the isolation contact region 132 and the buried layer 104. In other words, substantially the same current will flow through the isolation contact region 132, the resistive region 112, the isolation tie region 124 and the buried layer 104 when the vertical parasitic bipolar transistor of the semiconductor device structure 700 is turned on. As a result, when the dopant concentration of the resistive region 112 is less than that of the isolation tie region 124 and the isolation contact region 132, the resistive region 112 increases the series resistance between the isolation contact region 132 and the buried layer 104. In an exemplary embodiment, the series resistance of the resistive region 112 and the isolation tie region 124, that is, the series resistance between the isolation contact region 132 and the buried layer 104, is greater than a resistance of the buried layer 104. In this manner, the resistive region 112 increases the on-resistance of a vertical parasitic bipolar transistor of the semiconductor device structure 700, as described in greater detail below. It should be noted the first dielectric region 116 also increases the on-resistance of the vertical parasitic bipolar transistor as compared a structure that includes resistive region 112 but lacks dielectric region 116.

Referring now to FIG. 8, in an exemplary embodiment, after forming contact regions 132, 134, 136, the fabrication process continues by removing the implantation mask 121 and forming a body contact region 138 within the body region 122. The body contact region 138 has the same conductivity-type as the body region 122. In an exemplary embodiment, the body contact region 138 is formed by masking the semiconductor device structure 700 with an implantation mask 125 that leaves exposed the underlying region of the epitaxial layer 106 between the source contact region 136 and the dielectric region 118. The body contact region 138 is then formed by implanting ions of the second conductivity-determining impurity type, illustrated by arrows 127, in the body region 122 using the implantation mask 125 resulting in the semiconductor device structure 800 of FIG. 8. For example, in accordance with one embodiment, for an N-channel semiconductor device, the body contact region 138 is formed by implanting P-type ions, such as boron ions or a boron ionized species, with a dopant concentration in the range of about $1 \times 10^{19}/cm^3$ to about $1 \times 10^{21}/cm^3$. For example, boron ions or a boron ionized species may be implanted with a dopant concentration of about $1 \times 10^{20}/cm^3$. As shown in FIG. 8, the ion implantation for the body contact region 138 is shallow such that the depth of the implantation for the body contact region 138 is less than that of the body region 122. After formation of the contact regions 132, 134, 136, 138, the semiconductor device structure 800 includes an LDMOS transistor structure 802 comprising a drain comprised of regions 114, 134, a source comprised of region 136, a body comprised of portions of regions 106, 122, 138 interposed between the drain and source, and a gate comprising gate structure 126.

Still referring to FIG. 8, it will be appreciated in the art that by virtue of the alternating conductivity-types of the semiconductor device structure 800, a first (or lateral) parasitic bipolar transistor is formed between the drain region and the source region through the well region of the transistor structure 802. For example, for an N-channel device, a parasitic NPN bipolar transistor is formed between the N-type drain (e.g., regions 114, 134) and the N-type source (e.g., region 136) through the P-well (e.g., portions of the body region 122 and/or epitaxial layer 106 between regions 114, 136) of the transistor structure 802. The dimensions and dopant concentrations of drain region 114, source region 136 and the portions of the body region 122 and/or epitaxial layer 106 between the drain region 114 and source region 136 influences the series resistance of the lateral parasitic bipolar transistor (or the on-resistance of the LDMOS transistor 802). In an exemplary embodiment, the on-resistance of the LDMOS transistor 802, that is, the series resistance between the drain region 114, 134 and the source region 136 when voltage applied to the gate structure 126 (e.g., to conductive material 130) exceeds the threshold voltage of the LDMOS transistor 802, may range from about one hundred milliohms to about three hundred ohms, or potentially other values, depending on the needs of a particular application.

It will be appreciated in the art that when an electrical connection is made between the isolation structure 702 and the drain region to provide a double RESURF device, a second (or vertical) parasitic bipolar transistor is formed between the buried layer 104 and the source region through the well region of the transistor structure. For example, for an N-channel device, a vertical parasitic NPN bipolar transistor is formed between the N-type buried layer 104 and the N-type source (e.g., region 136) through the P-well (e.g., portions of body region 122 and/or epitaxial layer 106 between the buried layer 104 and the source contact region 136) of the transistor structure 802. The resistive region 112 is preferably configured to provide a resistance electrically in series with the isolation tie region 124 between the isolation contact region 132 and the buried layer 104 between about 100 ohms and 1 megohm. In an exemplary embodiment, the series resistance provided by resistive region 112 is between about 1 kilohm to about 2 kilohms. It should be appreciated that, in practice, the resistance of the resistive region 112 will vary depending on the device width, the gain of the parasitic bipolar transistors, the series resistance of the lateral parasitic bipolar transistor, and the needs of a particular implementation. In an exemplary embodiment, the combined series resistance of the resistive region 112, the isolation tie region 124, and the buried layer 104 is greater than a resistance of the drain region 114, such that the combined series resistance of the resistive region 112, the isolation tie region 124, and the buried layer 104 is greater than the on-resistance of the LDMOS transistor 802. In an exemplary embodiment, the combined series resistance of the resistive region 112, the isolation tie region 124, and the buried layer 104 is greater than the on-resistance of the LDMOS transistor 802 by at least factor of three.

Figure 9:
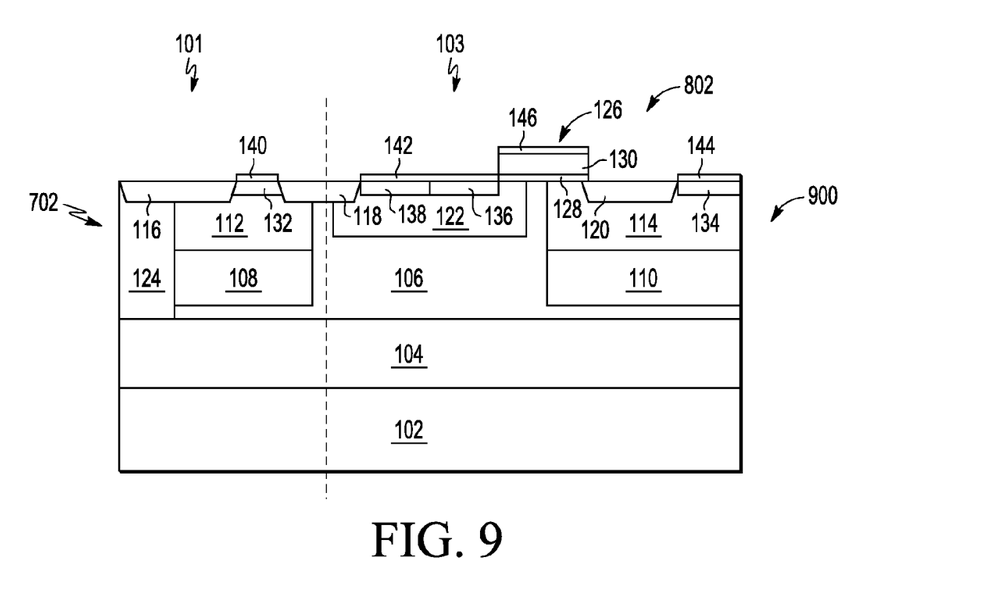

Referring now to FIG. 9, after forming contact regions 132, 134, 136, 138, the fabrication process continues by removing the implantation mask 125 and forming contacts 140, 142, 144, 146 overlying the contact regions 132, 134, 136, 138 and the gate structure 126. In an exemplary embodiment, the contacts 140, 142, 144, 146 are realized as a metal silicide layer. The contacts 140, 142, 144, 146 may be formed by depositing a blanket layer of silicide-forming metal onto the surface of the contact regions 132, 134, 136, 138 and the surface of the gate structure 126 and heated, for example by RTA, to react with exposed silicon and form a metal silicide layer 140, 142, 144, 146 at the top of the contact regions 132, 134, 136, 138 as well as on gate structure 126. In this regard, in an exemplary embodiment, the source contact region 136 and the body contact region 138 are electrically connected (or shorted) by the overlying contact 142, such that the body is biased to the source voltage. The silicide-forming metal can be, for example, cobalt, nickel, rhenium, ruthenium, or palladium, or alloys thereof and preferably is cobalt, nickel, or nickel plus about 5% platinum. Any silicide-forming metal that is not in contact with exposed silicon, for example the silicide-forming metal that is deposited on the dielectric regions 116, 118, 120 does not react during the RTA to form a silicide and may subsequently be removed in a conventional manner. In this manner, the contacts 140, 142, 144 are self-aligned with the underlying contact regions 132, 134, 136, 138. Although not illustrated in FIG. 9, it will be appreciated in the art that in practice, sidewall spacers may be formed about the sidewalls of the gate structure 126 to prevent silicide formation on the exposed sides of any silicon (e.g., polysilicon) of the conductive layer(s) 130. As shown, in an exemplary embodiment, the source contact region 136 and the body contact region 138 are electrically connected (or shorted) by contact 142 such that the source and body of the transistor structure 802 are biased to the same electrical potential, as will be appreciated in the art.

Figure 10:
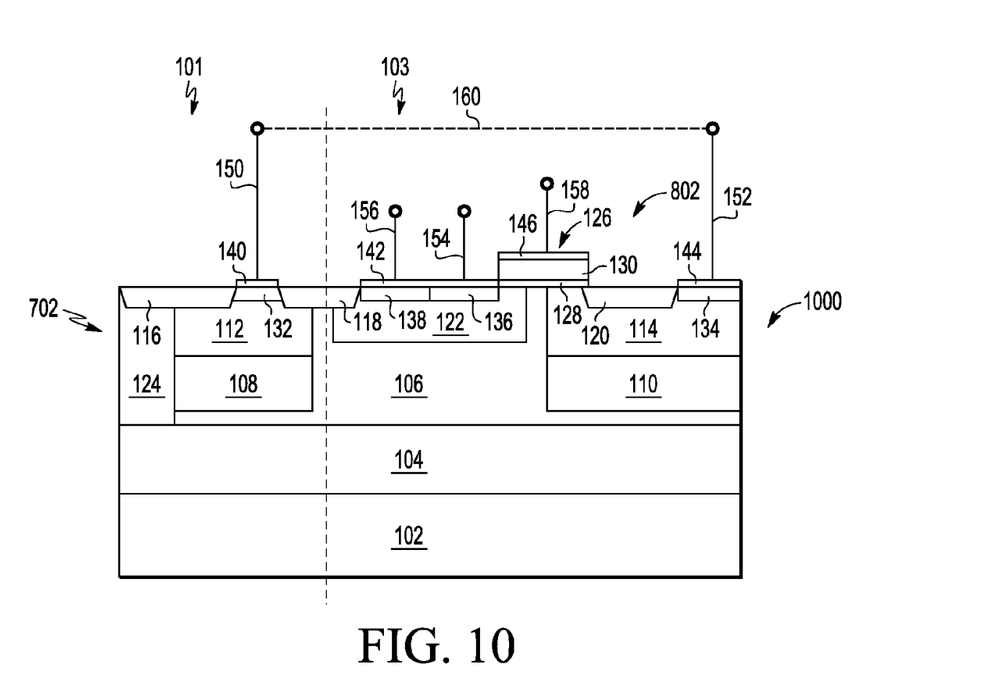

Referring now to FIG. 10, in an exemplary embodiment, a first terminal 150 (or isolation terminal) is formed overlying or otherwise in contact with the isolation contact 140 to create an electrical interface with and/or electrical connection to the isolation structure 702. As used herein, a terminal generally represents a conductive element or portion of a conductive element that interfaces to a portion of the semiconductor device structure 1000. For example, a contact plug formed in a layer of dielectric material overlying the semiconductor device structure 1000 (not shown) will typically form a terminal. A second terminal 152 (or drain terminal) overlies or otherwise contacts the drain contact 144 to create an electrical interface with and/or electrical connection to the drain of the transistor structure 802, a third terminal 154 (or source terminal) overlies or otherwise contacts the source/body contact 142 to create an electrical interface with and/or electrical connection to the source of the transistor structure 802, a fourth terminal 156 (or body terminal) overlies or otherwise contacts the source/body contact 144 to create an electrical interface with and/or electrical connection to the body of the transistor structure 802, and a fifth terminal 158 (or gate terminal) overlies or otherwise contacts the gate contact 146 to create an electrical interface with and/or electrical connection to the gate of the transistor structure 802.

Although one or more additional process steps may be performed next, in an exemplary embodiment, the fabrication process continues by forming a first conductive connection 160 between the isolation terminal 150 and the drain terminal 152 which electrically connects isolation contact region 132 and the drain contact region 134. In an exemplary embodiment, the conductive connection 160 is realized as a conductive trace formed from metal or heavily doped polysilicon which overlies a dielectric material (not shown) that overlies and otherwise insulates the upper surface of the semiconductor device structure 1000. In this manner, the resistive region 112 and the isolation tie region 124 are configured electrically in series between the drain region 114 and the buried layer 104, wherein the voltage potential of the buried layer 104 is substantially equal to the voltage potential of the drain region 114 minus any voltage potential drop across the isolation structure 702. Thus, by increasing the series resistance of the isolation structure 702, for example, by increasing the separation distance between the isolation contact region 132 and isolation tie region 124 (e.g., by adjusting dimensions of resistive region 112 and/or dielectric region 116) or decreasing the dopant concentration of the resistive region 112, the on-resistance of the vertical parasitic bipolar transistor is increased, thereby mitigating the deleterious effects of the vertical parasitic bipolar transistor on the snapback voltage of the transistor structure 802 and/or semiconductor device structure 1000. In an exemplary embodiment, the resistance of the resistive region 112 is greater than or equal to the effective resistance of the drain region 114 in the lateral parasitic bipolar transistor, such that the on-resistance of the vertical parasitic bipolar transistor is greater than the on-resistance of the lateral parasitic bipolar transistor. As a result, by increasing the on-resistance of the vertical parasitic bipolar transistor relative to the lateral parasitic bipolar transistor, the snapback voltage of the transistor structure 802 and/or semiconductor device structure 1000 is dictated by characteristics of the lateral parasitic bipolar transistor rather than the vertical parasitic bipolar transistor. It should be noted that during normal operation where voltages at the drain terminal 152 relative to the source terminal 154 are less than the breakdown voltage, the increased series resistance of the isolation structure 702 will have a negligible impact on the on-resistance of the semiconductor device structure 1000 and/or transistor structure 802 because substantially zero current will flow through the isolation structure 702 at normal operating voltages (i.e., voltages below the breakdown voltage).

In accordance with an alternative embodiment, the semiconductor device structure 1000 may be implemented with a connection between the isolation terminal 150 and the source terminal 154, resulting in an isolated single RESURF LDMOS device, in which case the connection 160 between the isolation terminal 150 and the drain terminal 152 need not be present. In this embodiment, the vertical parasitic bipolar transistor is formed between the buried layer 104 and the drain region through the well region of the transistor structure. For example, for an N-channel device, a vertical parasitic NPN bipolar transistor is formed between the N-type buried layer 104 and the N-type drain (e.g., regions 114, 134) through intervening P-type semiconductor material (e.g., portions of region 110 and/or epitaxial layer 106 between the buried layer 104 and region 114). In an exemplary embodiment, the combined series resistance of the resistive region 112, the isolation tie region 124, and the buried layer 104 remains greater than the on-resistance of the LDMOS transistor 802 as described above.

Figure 11:
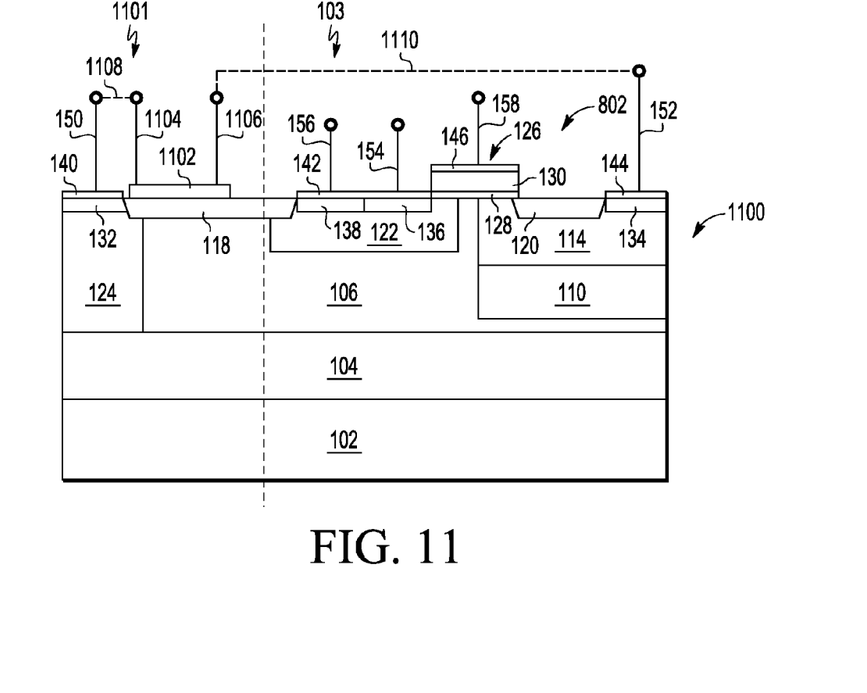
FIG. 11 illustrates, in cross section, a semiconductor device structure including a LDMOS transistor structure in accordance with one embodiment of the invention.

FIG. 11 depicts a semiconductor device structure 1100 in accordance with another embodiment. As shown in FIG. 11, the isolation region 1101 of the semiconductor device structure 1100 does not include a resistive region (e.g., region 112) of the first conductivity-type or a corresponding underlying region (e.g., region 108) of the second conductivity-type, but rather, the isolation contact region 132 is formed in the upper portion of the isolation tie region 124. In an exemplary embodiment, in lieu of the resistive region 112 described above, the semiconductor device structure 1100 includes a resistive structure 1102 formed overlying a dielectric region 118 on the upper surface of the semiconductor device structure 1100. In this regard, the resistive structure 1102 may be formed by depositing a layer of polysilicon (or another suitable conductive or semiconductive material) overlying surface of the semiconductor device structure and removing (or etching) portions of the polysilicon which are not overlying the dielectric region 118, resulting in the etched resistive material shown in FIG. 11. After forming the resistive structure 1102, terminals 1104, 1106 are formed or otherwise provided such that the resistive structure 1102 may be electrically connected to one or more regions of the semiconductor device structure 1100. In an exemplary embodiment, a connection 1108 is formed between the isolation terminal 150 and a first terminal 1104 of the resistive structure 1102 and another connection 1110 is formed between the drain terminal 152 and a second terminal 1106 of the resistive structure 1102, such that the resistive structure 1102 functions as a resistive element providing a resistance electrically in series between the terminals 150, 152. In this regard, the resistive structure 1102 is electrically in series with the vertical parasitic bipolar transistor of the semiconductor device structure 1100, such that the on-resistance of the vertical parasitic bipolar transistor is increased, thereby mitigating the effects of the vertical parasitic bipolar transistor on the snapback voltage of the transistor structure 802 and/or semiconductor device structure 1100 in a similar manner as described above. In an exemplary embodiment, the resistance of the resistive structure 1102 is greater than or equal to the effective resistance of the drain region 114 in the lateral parasitic bipolar transistor, such that the on-resistance of the vertical parasitic bipolar transistor is greater than the on-resistance of the lateral parasitic bipolar transistor. In a similar manner as described above in the context of FIG. 11, in an alternative embodiment, the semiconductor device structure 1100 may be implemented with a connection between terminal 1106 and the source terminal 154, resulting in an isolated single RESURF LDMOS device, in which case the connection 1110 between the drain terminal 152 and terminal 1106 need not be present.

Figure 12:
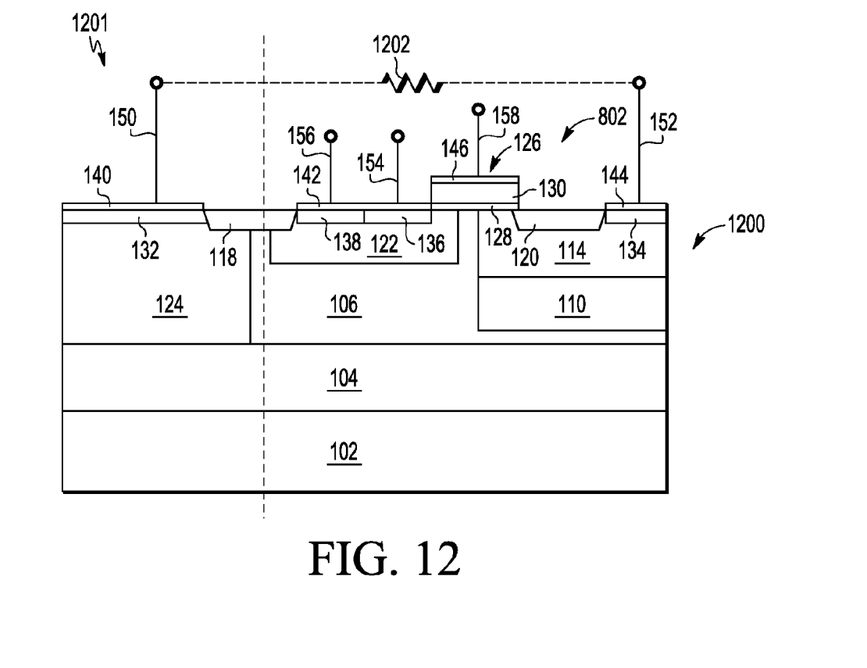
FIG. 12 illustrates, in cross section, a semiconductor device structure including a LDMOS transistor structure in accordance with another embodiment of the invention.

FIG. 12 depicts a semiconductor device structure 1200 in accordance with another embodiment. As described above in the context of FIG. 11, the isolation region 1201 of the semiconductor device structure 1200 does not include a resistive region. In the illustrated embodiment of FIG. 12, the connection 160 between the isolation terminal 150 and the drain terminal 152 includes a resistive element 1202 that is configured to provide a resistance that is electrically in series between the terminals 150, 152. In this regard, the resistive element 1202 may be realized as a resistor that is electrically connected between the isolation terminal 150 and the drain terminal 152, and may be implemented as part of an interconnect layer overlying the semiconductor device structure 1200, as a discrete component external to the semiconductor device structure 1200, or in another suitable manner. The resistive element 1202 is electrically in series with the vertical parasitic bipolar transistor of the semiconductor device structure 1200, such that the on-resistance of the vertical parasitic bipolar transistor is increased, thereby mitigating the effects of the vertical parasitic bipolar transistor on the snapback voltage of the transistor structure 802 and/or semiconductor device structure 1200 in a similar manner as described above. In an exemplary embodiment, the resistance of the resistive element 1202 is greater than or equal to the effective resistance of the drain region 114 in the lateral parasitic bipolar transistor, such that the on-resistance of the vertical parasitic bipolar transistor is greater than the on-resistance of the lateral parasitic bipolar transistor. In a similar manner as described above in the context of FIGS. 10 and 11, in an alternative embodiment, the semiconductor device structure 1200 may be implemented with the resistive element 1202 connected electrically in series between the isolation terminal 150 and the source terminal 154, resulting in an isolated single RESURF LDMOS device, in which case the connection 160 between the isolation terminal 150 and the drain terminal 152 need not be present.

One advantage of the semiconductor device structures and/or fabrication processes described above is that the on-resistance of a vertical parasitic bipolar transistor in a double RESURF LDMOS device is increased without impacting the on-resistance of the LDMOS. By increasing the on-resistance of the vertical parasitic bipolar transistor, the snapback voltage for the LDMOS device is increased relative to the breakdown voltage of the LDMOS device. This results in a larger design window and reduces manufacturing constraints for the ESD protection circuitry, which, in turn, improves the effectiveness of the ESD protection scheme, and thus, the reliability of the LDMOS device.

Devices and methods configured in accordance with example embodiments of the invention relate to:

An apparatus is provided for a semiconductor device structure. The semiconductor device structure comprises a buried region of semiconductor material having a first conductivity type, a first region of semiconductor material having a second conductivity type overlying the buried region, a source region of semiconductor material having the first conductivity type overlying the first region, a drain region of semiconductor material having the first conductivity type overlying the first region, wherein at least a portion of the first region is between the drain region and the source region, and a second region of semiconductor material having the first conductivity type overlying the buried region, the second region abutting the buried region to form an electrical contact with the buried region. A first resistance is configured electrically in series with the second region and the buried region, wherein a combined series resistance of the first resistance and the second region is greater than a resistance of the buried region. In accordance with one embodiment, a combined series resistance of the first resistance, the second region, and the buried region is greater than a resistance of the drain region. In another embodiment, a combined series resistance of the first resistance, the second region, and the buried region is greater than an on-resistance between the drain region and the source region. In a further embodiment, the combined series resistance of the first resistance, the second region, and the buried region is within a range of about 100 ohms to 1 megohm. In another embodiment, the combined series resistance of the first resistance, the second region, and the buried region is greater than the on-resistance by at least a factor of three. In accordance with yet another embodiment, the first resistance comprises a resistive region of semiconductor material having the first conductivity type abutting the second region to form a second electrical contact with the second region. In a further embodiment, the second region has a first dopant concentration and the resistive region has a second dopant concentration, wherein the first dopant concentration is greater than the second dopant concentration. In another embodiment, the semiconductor device structure further comprises a contact region of semiconductor material having the first conductivity type abutting the resistive region of semiconductor material, wherein the resistive region of semiconductor material and the second region are configured electrically in series between the contact region and the buried region. In yet another embodiment, the first resistance is configured electrically in series between the drain region and the second region. In another embodiment, the first resistance is configured electrically in series between the source region and the second region.

In another embodiment, an apparatus for a semiconductor device structure is provided. The semiconductor device structure comprises a first region of semiconductor material having a first conductivity type, a second region of semiconductor material having a second conductivity type overlying the first region, a third region of semiconductor material having the first conductivity type, the third region overlying the first region and abutting the first region to form an electrical contact with the first region, and a fourth region of semiconductor material having the first conductivity type, the fourth region abutting the third region to form an electrical contact with the third region. The third region and the fourth region are configured to provide an isolation path for biasing the first region, and the fourth region is configured to provide a resistance electrically in series with the third region and the first region, wherein a resistance of the fourth region is greater than a resistance of the first region. In a further embodiment, a dopant concentration of the third region is greater than a dopant concentration of the fourth region and a dopant concentration of the first region is greater than the dopant concentration of the fourth region. In another embodiment, the semiconductor device structure further comprises a fifth region of semiconductor material having the first conductivity type, the fifth region overlying the second region, wherein the third region and the fourth region are electrically in series between the fifth region and the first region, and the fifth region comprises a drain region or a source region for the semiconductor device structure. In accordance with another embodiment, the semiconductor device structure further comprises a contact region of the first conductivity type formed in the fourth region, wherein the third region and the fourth region are electrically in series between the contact region and the first region. In a further embodiment, the semiconductor device structure further comprises a dielectric region overlying the third region and adjacent to the contact region to isolate the third region from the contact region. In one embodiment, the first region of semiconductor material comprises a first N-type region of semiconductor material, the second region of semiconductor material comprises a P-type region of semiconductor material overlying the first N-type region of semiconductor material, the third region of semiconductor material comprises a second N-type region of semiconductor material overlying and abutting the first N-type region of semiconductor material, and the fourth region of semiconductor material comprises a third N-type region of semiconductor material abutting the second N-type region of semiconductor material, wherein at least a portion of the P-type region of semiconductor material is interposed between the first N-type region of semiconductor material and the third N-type region of semiconductor material, such that the second N-type region of semiconductor material is configured electrically in series between the first N-type region of semiconductor material and the third N-type region of semiconductor material. In another embodiment, the first region of semiconductor material comprises a first P-type region of semiconductor material, the second region of semiconductor material comprises an N-type region of semiconductor material overlying the first N-type region of semiconductor material, the third region of semiconductor material comprises a second P-type region of semiconductor material overlying and abutting the first P-type region of semiconductor material, and the fourth region of semiconductor material comprises a third P-type region of semiconductor material abutting the second P-type region of semiconductor material, wherein at least a portion of the N-type region of semiconductor material is interposed between the first P-type region of semiconductor material and the third P-type region of semiconductor material, such that the second P-type region of semiconductor material is configured electrically in series between the first P-type region of semiconductor material and the third P-type region of semiconductor material.

A method for fabricating a transistor in accordance with another embodiment. The method comprises providing a semiconductor substrate having a first region of semiconductor material and a second region of semiconductor material formed thereon, wherein the first region has a first conductivity type and the second region has a second conductivity type, the second region overlying the first region, forming a source region of semiconductor material having the first conductivity type within the second region, forming a drain region of semiconductor material having the first conductivity type within the second region, wherein at least a portion of the second region is between the drain region and the source region, and forming an isolation tie region of semiconductor material in the second region of semiconductor material, the isolation tie region having the first conductivity type, wherein the isolation tie region overlies the first region and abuts the first region to form an electrical contact with the first region. The method further comprises providing a first resistance configured electrically in series with the isolation tie region and the first region, wherein a combined series resistance of the first resistance and the isolation tie region is greater than a resistance of the first region. In a further embodiment, providing the first resistance comprises forming a resistive region of semiconductor material having the first conductivity type, the resistive region overlying at least a portion of the second region and abutting the isolation tie region to form a second electrical contact with the isolation tie region. In further embodiment, forming the isolation tie region of semiconductor material comprises implanting ions of a first conductivity-determining impurity type with a first dopant concentration into the isolation tie region of semiconductor material and forming the resistive region of semiconductor material comprises implanting ions of the first conductivity-determining impurity type with a second dopant concentration into the resistive region of semiconductor material, wherein the second dopant concentration is less than the first dopant concentration.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A semiconductor device structure comprising:
   a buried region of semiconductor material having a first conductivity type;
   a first region of semiconductor material having a second conductivity type overlying the buried region;
   a source region of semiconductor material having the first conductivity type overlying the first region;
   a drain region of semiconductor material having the first conductivity type overlying the first region, wherein at least a portion of the first region is between the drain region and the source region;
   a second region of semiconductor material having the first conductivity type overlying the buried region, the second region abutting the buried region to form an electrical contact with the buried region; and
   a first resistance configured electrically in series with the second region and the buried region, wherein a combined series resistance of the first resistance and the second region is greater than a resistance of the buried region.

2. The semiconductor device structure of claim 1, wherein a combined series resistance of the first resistance, the second region, and the buried region is greater than a resistance of the drain region.

3. The semiconductor device structure of claim 1, wherein a combined series resistance of the first resistance, the second region, and the buried region is greater than an on-resistance between the drain region and the source region.

4. The semiconductor device structure of claim 3, wherein the combined series resistance of the first resistance, the second region, and the buried region is within a range of about 100 ohms to 1 megohm.

5. The semiconductor device structure of claim 3, wherein the combined series resistance of the first resistance, the second region, and the buried region is greater than the on-resistance by at least a factor of three.

6. The semiconductor device structure of claim 1, wherein the first resistance comprises a resistive region of semiconductor material having the first conductivity type abutting the second region to form a second electrical contact with the second region.

7. The semiconductor device structure of claim 6, the second region having a first dopant concentration and the resistive region having a second dopant concentration, wherein the first dopant concentration is greater than the second dopant concentration.

8. The semiconductor device structure of claim 6, further comprising a contact region of semiconductor material having the first conductivity type abutting the resistive region of semiconductor material, wherein the resistive region of semiconductor material and the second region are configured electrically in series between the contact region and the buried region.

9. The semiconductor device structure of claim 1, wherein the first resistance is configured electrically in series between the drain region and the second region.

10. The semiconductor device structure of claim 1, wherein the first resistance is configured electrically in series between the source region and the second region.

11. A semiconductor device structure comprising:
- a first region of semiconductor material having a first conductivity type;
- a second region of semiconductor material having a second conductivity type overlying the first region;
- a third region of semiconductor material having the first conductivity type, the third region overlying the first region and abutting the first region to form an electrical contact with the first region; and
- a fourth region of semiconductor material having the first conductivity type, the fourth region abutting the third region to form an electrical contact with the third region, wherein:
  - the third region and the fourth region are configured to provide an isolation path for biasing the first region; and
  - the fourth region is configured to provide a resistance electrically in series with the third region and the first region, wherein a resistance of the fourth region is greater than a resistance of the first region.

12. The semiconductor device structure of claim 11, wherein:
- a dopant concentration of the third region is greater than a dopant concentration of the fourth region; and
- a dopant concentration of the first region is greater than the dopant concentration of the fourth region.

13. The semiconductor device structure of claim 11, further comprising a fifth region of semiconductor material having the first conductivity type, the fifth region overlying the second region, wherein:
- the third region and the fourth region are electrically in series between the fifth region and the first region; and
- the fifth region comprises a drain region or a source region for the semiconductor device structure.

14. The semiconductor device structure of claim 11, further comprising a contact region of the first conductivity type formed in the fourth region, wherein the third region and the fourth region are electrically in series between the contact region and the first region.

15. The semiconductor device structure of claim 14, further comprising a dielectric region overlying the third region and adjacent to the contact region to isolate the third region from the contact region.

16. The semiconductor device structure of claim 11, wherein:
- the first region of semiconductor material comprises a first N-type region of semiconductor material;
- the second region of semiconductor material comprises a P-type region of semiconductor material overlying the first N-type region of semiconductor material;
- the third region of semiconductor material comprises a second N-type region of semiconductor material overlying and abutting the first N-type region of semiconductor material; and
- the fourth region of semiconductor material comprises a third N-type region of semiconductor material abutting the second N-type region of semiconductor material, wherein at least a portion of the P-type region of semiconductor material is interposed between the first N-type region of semiconductor material and the third N-type region of semiconductor material, such that the second N-type region of semiconductor material is configured electrically in series between the first N-type region of semiconductor material and the third N-type region of semiconductor material.

17. The semiconductor device structure of claim 11, wherein:
- the first region of semiconductor material comprises a first P-type region of semiconductor material;
- the second region of semiconductor material comprises an N-type region of semiconductor material overlying the first N-type region of semiconductor material;
- the third region of semiconductor material comprises a second P-type region of semiconductor material overlying and abutting the first P-type region of semiconductor material; and
- the fourth region of semiconductor material comprises a third P-type region of semiconductor material abutting the second P-type region of semiconductor material, wherein at least a portion of the N-type region of semiconductor material is interposed between the first P-type region of semiconductor material and the third P-type region of semiconductor material, such that the second P-type region of semiconductor material is configured electrically in series between the first P-type region of semiconductor material and the third P-type region of semiconductor material.

18. A method for fabricating a transistor, the method comprising:
- providing a semiconductor substrate having a first region of semiconductor material and a second region of semiconductor material formed thereon, wherein the first region has a first conductivity type and the second region has a second conductivity type, the second region overlying the first region;
- forming a source region of semiconductor material having the first conductivity type within the second region;
- forming a drain region of semiconductor material having the first conductivity type within the second region, wherein at least a portion of the second region is between the drain region and the source region;
- forming an isolation tie region of semiconductor material in the second region of semiconductor material, the isolation tie region having the first conductivity type, wherein the isolation tie region overlies the first region and abuts the first region to form an electrical contact with the first region; and
- providing a first resistance configured electrically in series with the isolation tie region and the first region, wherein a combined series resistance of the first resistance and the isolation tie region is greater than a resistance of the first region.

19. The method of claim 18, wherein providing the first resistance comprises forming a resistive region of semiconductor material having the first conductivity type, the resistive region overlying at least a portion of the second region and abutting the isolation tie region to form a second electrical contact with the isolation tie region.

20. The method of claim 19, wherein:
- forming the isolation tie region of semiconductor material comprises implanting ions of a first conductivity-determining impurity type with a first dopant concentration into the isolation tie region of semiconductor material; and
- forming the resistive region of semiconductor material comprises implanting ions of the first conductivity-determining impurity type with a second dopant concentration into the resistive region of semiconductor material, wherein the second dopant concentration is less than the first dopant concentration.

* * * * *